… … …

United States Patent [19]

Moon

[11] Patent Number: 5,157,002
[45] Date of Patent: Oct. 20, 1992

[54] METHOD FOR FORMING A MASK PATTERN FOR CONTACT HOLE

[75] Inventor: Seung C. Moon, Kyungki, Rep. of Korea

[73] Assignee: Hyundai Electronics Industries Co., Ltd., Rep. of Korea

[21] Appl. No.: 619,033

[22] Filed: Nov. 28, 1990

[30] Foreign Application Priority Data

Nov. 30, 1989 [KR] Rep. of Korea .................... 89-17555

[51] Int. Cl.$^5$ ......................................... H01L 21/465
[52] U.S. Cl. ................................... 437/228; 437/924; 148/DIG. 102; 156/644
[58] Field of Search ............... 437/228, 924; 148/102, 148/106; 156/644

[56] References Cited

U.S. PATENT DOCUMENTS 4,619,037 10/1986 Taguchi et al. .
4,764,484 8/1988 Mo .
4,966,867 10/1990 Crotti et al. .................... 437/228

FOREIGN PATENT DOCUMENTS 2-30141 1/1990 Japan .................................. 437/228

Primary Examiner—Olik Chaudhuri
Assistant Examiner—G. Fourson
Attorney, Agent, or Firm—Ladas & Parry

[57] ABSTRACT

A method for forming a mask pattern for contact hole in a highly integrated semiconductor device is disclosed. The method according to the invention utilizes a SOG film in order to form an accurate and compact mask pattern for the formation of a contact hole within the highly limited area at a predetermined semiconductor layer where a sizable step difference exists. The method according to the invention is also applicable for manufacturing a multi-layered highly integrated semiconductor device.

21 Claims, 2 Drawing Sheets

METHOD FOR FORMING A MASK PATTERN FOR CONTACT HOLE

BACKGROUND OF INVENTION

1. Field of the Invention

The invention relates to a method for forming a mask pattern for a contact hole in a highly integrated semiconductor, and more particularly to a method for forming a mask pattern for a contact hole utilizing a SOG (Spin-On-Glass) film, in order to form an accurate and compact mask pattern for the formation of a contact hole at a predetermined semiconductor layer where a sizable step difference exists.

2. Information Disclosure Statement

In general, when the mask pattern process is performed by means of an optical lithographic etching process utilizing a single-layered photoresist layer as a mask layer, if the area where the mask pattern for a contact hole is to be formed is very limited, the resolution of the optical lithographic apparatus is decreased to less than 0.1–0.2 micro meter relative to the resolution of the line pattern thereof which defines a lay-out of the mask pattern for the contact hole. This is due to the dispersion phenomenon or the interference phenomenon of the light beam projected from the optical lithographic apparatus, since the above mentioned area where the light beam is projected to form the mask pattern for the contact hole is so limited or compact. As the integration of the semiconductor device increases, the size of the mask pattern to form the contact hole decreases.

Thus, in the manufacturing process of a highly integrated semiconductor device above 64 Mega bits DRAM, it is difficult to form the desired mask pattern for forming a contact hole which requires an area of, for example, below 0.5×0.5 micro meter. Even though a mask pattern is provided, the profile of the resulting photoresist mask layer for the mask pattern becomes, undesirably, sloped. Further, where the mask pattern process is performed on a multi-layered semiconductor device and since the photoresist layer which is a mask layer for contact mask pattern is deposited irregularly on the multi-layered semiconductor device, accurate control of the critical dimensions between contact holes cannot be achieved when a plurality of contact holes is being formed on the semiconductor device.

In particular, when a mask pattern for a contact hole is formed by utilizing a laser stepper with a deep ultraviolet wave length of, for example, 193 nano meters though 248 nano meters, in an optical lithographic apparatus, a relatively large amount optical energy is required due to the low intensity power of the deep ultraviolet source and the insensitivity of the photoresist mask layer to the deep ultraviolet wave, thereby requiring a relatively long process time. Further, due to the loss of the considerable amount of optical energy during the process, the life of the deep ultraviolet source used in the apparatus is undesirably limited.

Therefore, it is an object of the present invention to solve the problems set forth above, and to provide a method for forming a mask pattern for a contact hole utilizing a SOG film, in order to easily form the contact hole within the highly limited area available in the highly integrated semiconductor device of the DRAM above 64 mega bits.

According to the present invention, the reasons why the SOG film mentioned above is utilized during the process of the mask pattern for a contact hole are as follows. That is, it is assumed that, in general, the design rule for the mask pattern process for manufacturing the DRAM above 16 mega bits requires for the size of a line width of, at least, 0.5–0.6 micro meters. However, since the design rule for a contact hole for manufacturing a DRAM above 64 mega bits generally requires a line width size of 0.3–0.4 micro meters, an improved optical lithographic apparatus having high resolution characteristics is required for manufacturing the DRAM above 64 mega bits. Accordingly, approaches have been developed for increasing the resolution of the apparatus which will be described hereinafter.

One approach increased the "NA" (Numerical Aperture) of the protective lens of the optical lithographic apparatus. A second approach shortened the wave length of the light beam of the optical lithographic apparatus, as fully expressed from the equations described hereinafter. That is, it is assumed that the resolution ability "R" of the optical lithographic apparatus is expressed as follows:

$$R = K \frac{\lambda}{NA} \quad (1)$$

in which
"R" is the resolution ability;
"K" is the process constant (0.4–0.8);
"λ" is the wave length of the light beam; and,
"NA" is the numerical aperture of the protective lens.

Accordingly, as fully understood from the equation (1), as the numerical aperture NA increases, the wave length decreases and the process constant K decreases, the resolution ability R increases. However, according to equation (2), as the numerical aperture NA of the protective lens increases, the depth of focus (D.O.F) of the protective lens instantaneously decreases. That is, the depth of focus (D.O.F) is expressed as follow:

$$D.O.F = \pm K \frac{\lambda}{(NA)} \quad (2)$$

Thus, in order to increase the resolution ability "R", as the numerical aperture "NA" of the protective lens increases, the depth of focus (D.O.F) of the protective lens decreases, so there is no problem when a mask pattern is formed on a flat wafer where no step difference exists. However, when a mask pattern process is performed on a wafer where a considerable step difference exists, since the depth of focus (D.O.F) of the protective lens decreases, the resolution ability "R" decreases so that it is more difficult to perform the mask patterning process.

Due to the reasons described above, an approach has been made to develop an optical lithographic apparatus having a shortened wave length of the light beam of the apparatus and an improved numerical aperture "NA" of the protective lens thereof.

Accordingly, in a DRAM above 64 Mega bits since the line width size in the design rule of the optical lithographic etching process requires a line width size equal to or less than 0.4 micro meter, obtaining a desirable resolution of the optical lithographic apparatus should be first considered during the mask pattern process which is performed on the flat wafer. Although the desirable resolution thereof is obtainable on a flat wafer, it is very difficult to obtain a successful resulting resolution thereof on a wafer having a considerable step difference. In order to overcome the above problem due to the step difference, the design for the mask pattern process should be made in order to avoid the problem due to the step difference. In addition, by planarizing the step difference utilizing additional material, such as, for example, SOG film, when a lithographic etching process is performed on the wafer where a considerable step difference exists, it is consequently possible to remove the problem of decreasing the resolution ability of the optical lithographic apparatus due to the step difference.

The preceding object should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

A method for forming a mask pattern for a contact hole of the present invention is defined by the claims with a specific embodiment: shown in the attached drawings. For the purpose of summarizing the invention, the invention relates to a method of forming a mask pattern for a contact hole which comprises depositing a conducting layer on a semiconductor substrate and removing portions of the conducting layer from the semiconductor substrate to form adjacent first patterns. Adjacent first patterns are spaced apart on the surface of the semiconductor substrate relative to each other and extend up from the surface of the semiconductor substrate resulting in a step difference between the surface of the semiconductor substrate and the surface of the adjacent first patterns. That is, the semiconductor substrate is a floor whereas the adjacent first patterns form plateaus thereon. The removal of portions of the conducting layer which exposes portions of the semiconductor substrate includes the exposing of the semiconductor substrate positioned, i.e. extending, between the adjacent first patterns. An insulating layer is deposited on the entire surface of the resulting structure which comprises the adjacent first patterns and the exposed portions of the semiconductor substrate which impart an unevenness to the surface of the insulating layer. A nitride layer is then deposited on the uneven insulating layer which imparts an unevenness to the surface of the nitride layer. The nitride layer is to protect the insulating layer by functioning as an etch stop layer. A SOG film is deposited on the nitride layer. The SOG film is a self-leveling film which results in a flat surface on the uneven nitride layer. The SOG film is heated to impart a high anticorrosive characteristic thereto to maintain a normal etch rate of the SOG film. A first photoresist layer is deposited on the SOG film. The photoresist layer deposited on the SOG film is removed to thereby expose the SOG film thereunder, except for a portion of the photoresist layer on the SOG film positioned above the semiconductor substrate extending between the adjacent first patterns. The exposed SOG film is removed thereby exposing the nitride layer thereunder, except for the portion of the SOG film positioned beneath the photoresist layer and on the nitride layer above the semiconductor substrate extending between the adjacent first patterns thereby forming a second pattern comprising the portion of the photoresist layer deposited on the SOG film which is deposited on the nitride layer positioned above the semiconductor substrate extending between the adjacent first patterns. The remaining first photoresist layer is removed and a second photoresist layer is deposited on the entire surface of the resulting structure. The resulting structure comprises the SOG film positioned above the semiconductor substrate extending between the adjacent first patterns and the exposed nitride layer. The second photoresist layer is planarized and removed to expose a top surface of the SOG film positioned above the semiconductor substrate extending between the adjacent first patterns. The SOG film so positioned is etched to expose the nitride film thereunder thereby forming a mask pattern for a contact hole in the second photoresist layer.

The additional step of forming a contact hole is accomplished by sequentially etching the exposed nitride layer and the underlying insulating layer positioned above the semiconductor substrate extending between the adjacent first patterns utilizing the mask pattern for contact hole, thereby forming a contact hole accessing a portion of the semiconductor substrate extending between the adjacent first patterns.

The SOG film may be heated in a hot plate at a temperature of about 200 degrees Celsius for about 1 minute or may be heated in a convection oven at a temperature of abut 200 degrees Celsius for about 30 minutes.

In forming the second pattern, the SOG film is removed by etching in the presence of a gas selected from the group consisting of: CHF, CF+$O_2$ or CHF+$O_2$ to form the second pattern comprising the portion of the SOG film positioned above the semiconductor substrate extending between the adjacent first patterns with the portion of the first photoresist layer positioned on the SOG film.

The second photoresist layer is removed to the extent to expose the top surface of the SOG film, preferably by a blanket etch back process using reactive ion etching (RIE) or a developer to expose the top surface of the remaining SOG film. Preferably, the second photoresist layer is planarized prior to being removed to expose the top surface of the SOG film.

The mask pattern for contact hole is formed by dipping the exposed SOG film into a chemical etchant to remove the SOG film positioned above the semiconductor substrate extending between the adjacent first patterns. Preferably, the etchants are selected from the group consisting of: $NH_4OH$:HF, NiKOH or Deionized water-HF.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

Figure 1:
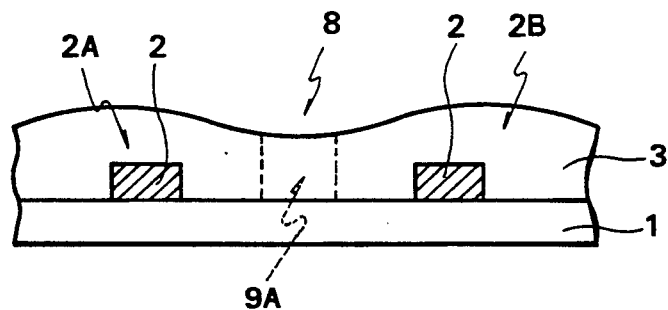
FIG. 1 illustrates a cross-sectional view of the semiconductor device for explaining a mask pattern process to form a mask pattern for contact hole according to the invention.

FIG. 1 is a sectional view of the semiconductor device illustrating a portion of the mask pattern process to form a mask pattern for a contact hole on a semiconductor substrate. A conducting layer 2 is deposited on the semiconductor substrate 1, for example, silicon substrate. First patterns 2A and 2B, which are spaced apart relative to each other, are formed on a portion of the silicon substrate 1 by removing a portion of the conducting layer 2. An insulating layer 3 is deposited on the entire surface of the resulting structure. The insulating layer 3 is preferably a BPSG (Boro-Phospho-Silicate-Glass) or PSG (Phospho-Silicate-Glass).

According to the prior art, it is noted that in order to form a contact hole 9A into the insulating layer 3 positioned at a contact region 8, as shown in dotted lines, a selective photoresist etching back process is performed on the insulating layer 3. Such process is well known in the art. However, according to the prior art method mentioned above, where manufacturing a highly integrated semiconductor device above the 64 Mega bits DRAM, since an area where a mask pattern for contact hole is so limited, it is very difficult to perform the contact mask patterning process, as previously mentioned above. Accordingly, in order to overcome above the problem, a novel method for forming a mask pattern for a contact hole is provided utilizing a SOG film having a low viscosity, which will be described in conjunction with FIG. 2 to FIG. 6.

Figure 2:
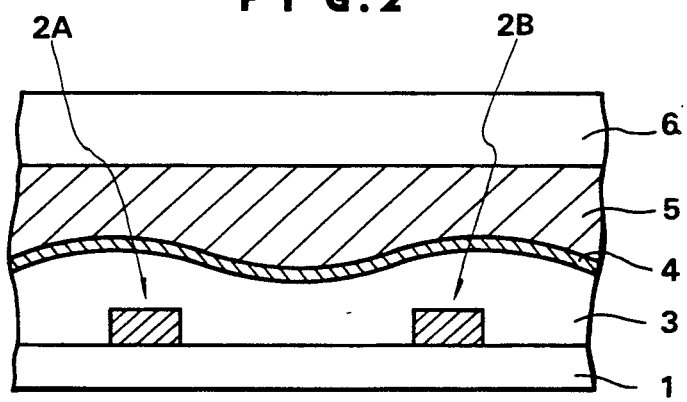
FIG. 2 illustrates a cross-sectional view of the semiconductor device in which a nitride layer, a SOG film and a first photoresist layer is sequentially deposited on the structure of FIG. 1.

FIG. 2 illustrates a cross-sectional view in which a nitride layer, a SOG film and a first photoresist layer are sequentially deposited on the resulting structure of FIG. 1. The nitride layer 4 is deposited, as thick as, for example, 200-300 Angstroms, on the insulating layer 3, and a SOG film 5 and a first photoresist layer 6 are then sequentially deposited on the nitride layer 4. The nitride layer 4 prevents the underlying insulating layer 3 from being etched and thus acts as an etching end point detection during the etching process of the SOG film 5, which is to be performed later. The SOG film 5 is deposited, as thick as, for example, above 1.0 micro meter, and is then baked by heating it at a predetermined temperature of 200 degree Celsius for a predetermined period of 1 minute in a hot plate, not shown in the drawing, or is baked by heating it at a predetermined temperature of 200 degree Celsius for a predetermined period of 30 minutes in a convection oven, not shown.

Due to the baking process of the SOG film 5, the SOG film 5 attains a desirable high anticorrosity characteristic during the following dry etching process thereof, so that an etching rate of the etching process maintains normal, so a mask layer for a contact hole in accurately perpendicular form can be obtained, which will be fully described hereinafter. Since the thickness of the deposited SOG film 5 is an important factor to determine the thickness of the first photoresist layer 6 to be deposited, it is selected the thickness of depositing the SOG film 5 within 1.0 to 1.5 micro meters, taking into consideration of the step difference of the first pattern 2A and 2B, and the etching selectivity during an etching process of the insulating layer 3. Also the first photoresist layer 6 deposited on the SOG film 5 is formed, as thick as, 0.5 to 1.0 micro meters, which is to be taken into consideration of the etching selectivity in etching the SOG film 5.

Figure 3:
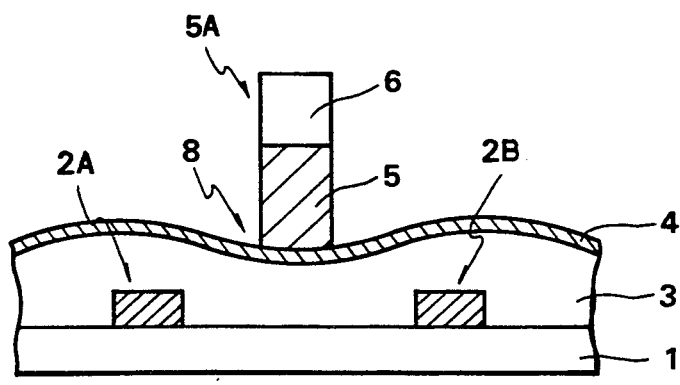
FIG. 3 illustrates a cross-sectional view of the semiconductor device in which a second pattern is formed on the structure of FIG. 2.

FIG. 3 illustrates a cross-sectional view in which a second pattern is formed on the resulting structure of FIG. 2. The photoresist layer 6 is removed except for a portion positioned over the contact region 8 between the first patterns 2A and 2B, where a contact hole will be later formed, to thereby expose a portion of the SOG film 5. Thereafter, a second pattern 5A is formed by etching the exposed SOG film 5 simultaneously with application of certain conditional gases, for example: $CHF$, $CF + O_2$ or $CHF + O_2$. At the time of the etching process above, the nitride layer 4 also acts as a protective layer for the insulating layer 3.

Figure 4:
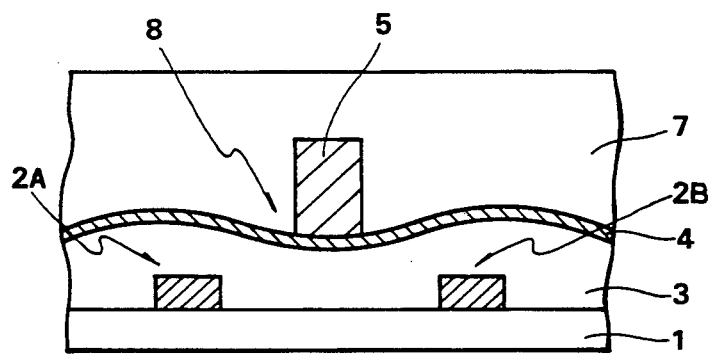
FIG. 4 illustrates a cross-sectional view of the semiconductor device in which a second photoresist layer is deposited on the entire surface of the structure of FIG. 3.

FIG. 4 illustrates a cross-sectional view in which the first photoresist layer 6 remaining in conjunction with FIG. 3 is completely removed, and a second photoresist layer 7 is then deposited, as thick as, 1.5 to 2.0 micro meters, on the entire surface of the resulting structure including the SOG film 5 remaining at the contact region 8. The second photoresist layer is then planarized.

Figure 5:
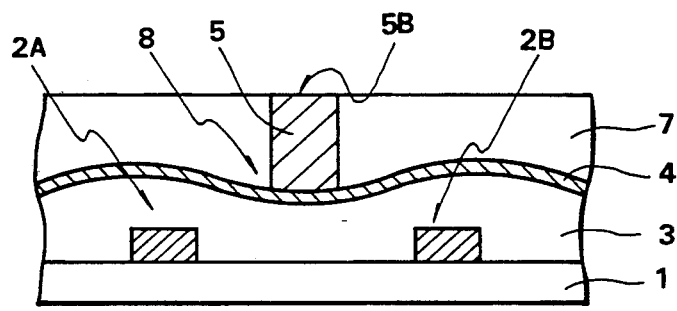
FIG. 5 illustrates a cross-sectional view of the semiconductor device in which the second photoresist layer is removed until a top surface of the SOG film is exposed.

FIG. 5 illustrates a cross-sectional view in which the second photoresist layer 7 is removed until the top surface of the SOG film is exposed. The second photoresist layer 7 is removed by a blanket etch back process thereof, utilizing an $O_2$ RIE (Reactive Ion Etching) or a developer until the top surface 5B of the remaining SOG film 5 is exposed, without utilizing any additional mask patterning process.

Figure 6:
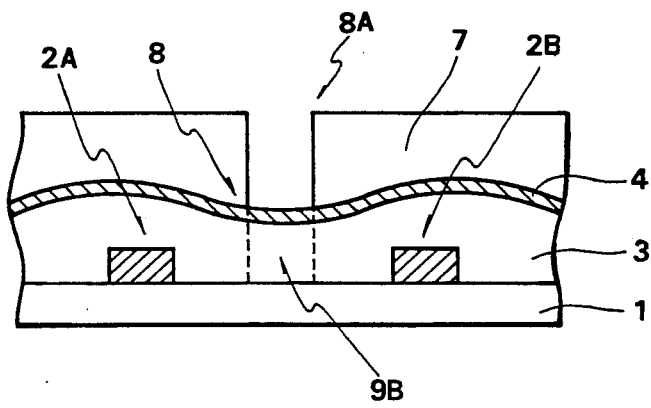
FIG. 6 illustrates a cross-sectional view of the semiconductor device in which a mask pattern for contact hole is formed into the second photoresist layer.

FIG. 6 illustrates a cross-sectional view in which a mask pattern for a contact hole is formed at the second photoresist layer 7. The mask pattern 8A for the contact hole is formed by dipping the exposed SOG film 5 into a chemical etchant of, for example selected from an etchant having in a volume ratio of 50:1 ($NH_4OH:HK$), an etchant of 0.3 NiKOH, or an etchant having in a volume ratio of 10:1 (Deionized water:HF), to thereby remove the exposed SOG film 5 positioned over the contact region 8. Here, a portion of the nitride layer 4 is exposed during the process for forming the mask pattern 8A, and the exposed nitride layer 4 acts as a protective layer for the underlying insulating layer 3 to prevent it from being etched during the mask patterning process for the contact hole. Contact hole 9B is accurately formed by sequentially etching the exposed nitride layer 4 and the underlying insulating layer 3 utilizing the mask pattern 8A for contact hole. The remaining second photoresist layer 7 and the nitride layer 4 are completely removed utilizing a process which is well known in the art.

As described above, according to the present invention, in order to perform the mask patterning process for forming a contact hole in a considerably limited area, the mask polarity of the contact mask is inverted utilizing a SOG film, other than by directly projecting the light beam onto the contact mask layer, i.e. the photoresist layer, so that, according to the invention, a desirable resolution of the lithographic etching process can be obtained by considerably decreasing the dispersion phenomenon or the interference phenomenon of the light beam projected from the optical lithographic etching apparatus, thereby obtaining a desirable mask pattern for contact hole in the highly integrated semiconductor device Furthermore, the SOG film having a low viscosity has an excellent planarizing effect, so that it can be accomplished to overcome the problems due to the critical dimension loss occurred by the step difference at the predetermined portion at which contact holes are positioned. The process according to the present invention is applicable for manufacturing a multi-layered highly integrated semiconductor DRAM above 16 Mega bits.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A method for forming a mask pattern for a contact hole in a semiconductor device in order to form a contact hole at a contact region positioned between first patterns which are spaced apart relative to each other on a semiconductor substrate, the method comprising:

depositing an insulating layer on the entire semiconductor substrate;
depositing a nitride layer on the insulating layer;
forming a SOG, spin on glass, film on the nitride layer;
baking the SOG film for a period of time and at a temperature sufficient to impart a high anticorrosive characteristic thereto;
forming a first photoresist layer on the SOG film;
removing the first photoresist layer except for a portion on the SOG film positioned above the contact region, to thereby expose a portion of the SOG film;
forming a second pattern including the remaining portion of the first photoresist layer and the exposed SOG film by removing the exposed SOG film except for a portion positioned over the contact region;
removing the first photoresist layer on the SOG film for the second pattern;
depositing a second photoresist layer on the entire surface of the resulting structure including the SOG film for the second pattern;
removing the second photoresist layer to expose a top surface of the SOG film;
baking the resulting structure including the exposed SOG film; and
forming the mask pattern for the contact hole by removing the exposed SOG film to thereby expose a portion of the nitride layer positioned over the contact region and between the first patterns.

2. The method of claim 1 wherein the semiconductor substrate is a silicon substrate.

3. The method of claim 1 wherein the insulating layer is a Boro-Phospho-Silicate-Glass.

4. The method of claim 1 wherein the insulating layer is a Phospho-Silicate-Glass.

5. The method of claim 1 wherein the exposed SOG film is removed by performing a dry etching in the presence of a gas selected from the group consisting of: $CHF$, $CF+O_2$ or $CHF+O_2$ to form the second mask pattern.

6. The method of claim 1 wherein the second photoresist layer is removed to the extent to expose the top surface of the SOG film by a blanket etch back process.

7. The method of claim 1 wherein the second photoresist layer is planarized prior to being removed to the extent to expose the top surface of the SOG film.

8. The method of claim 1 wherein the mask pattern for the contact hole is formed by dipping the exposed SOG film into a chemical etchant to remove the SOG film positioned above the contact region.

9. The method of claim 8 wherein the etchant is selected from a group consisting of: $NH_4OH:HF$, $NiKOH$ and deionized water-HF.

10. The method of claim 1 further including the step of forming a contact hole in the insulating layer at the contact region by sequentially removing the exposed nitride layer and the insulating layer utilizing the mask pattern for contact hole.

11. The method of claim 1 wherein the baking of the SOG film is performed in a hot plate at a temperature of about 200 degrees Celsius for a period of about 1 minute.

12. The method of claim 1 wherein the baking of the SOG film is performed in a convection oven at a temperature of about 200 degrees Celsius for a period of about 30 minutes.

13. A method of forming a mask pattern for contact hole, comprising:

depositing a conducting layer 2 on a semiconductor substrate 1;
removing portions of the conducting layer 2 from the semiconductor substrate to form adjacent first patterns 2A, 2B which are spaced apart on the surface of the semiconductor substrate relative to each other and which extend up from the surface of the semiconductor substrate resulting in a step difference between the surface of the semiconductor substrate and the surface of the adjacent first patterns 2A, 2B and to expose portions of the semiconductor substrate including the semiconductor substrate extending between the adjacent first patterns 2A, 2B;
depositing an insulating layer 3 on the entire surface of the resulting structure which comprises the adjacent first patterns 2A, 2B and the exposed portions of the semiconductor substrate which impart an unevenness to the surface of the insulating layer 3;

depositing a nitride layer 4 on the uneven insulating layer 3 which imparts an unevenness to the surface of the nitride layer 4 to protect the insulating layer by functioning as an etch stop layer;

depositing a SOG, spin on glass, film 5 on the nitride layer 4 to provide a flat surfaced self-leveling film on the uneven nitride layer 4;

heating the SOG film 5 to impart a anticorrosive characteristic thereto;

depositing a first photoresist layer 6 on the SOG film 5;

removing the photoresist layer 6 deposited on the SOG film 5 to thereby expose the SOG film thereunder except for a portion of the photoresist layer 6 on the SOG film positioned above the semiconductor substrate extending between the adjacent first patterns 2A, 2B;

removing the exposed SOG film 5 to expose the nitride layer thereunder except for the portion of the SOG film beneath the photoresist layer 6 and on the nitride layer positioned above the semiconductor substrate extending between the adjacent first patterns 2A, 2B, thereby forming a second pattern 5A comprising the portion of the photoresist layer 6 deposited on the SOG film 5 which is deposited on the nitride layer positioned above the semiconductor substrate extending between the adjacent first patterns 2A, 2B;

removing the remaining first photoresist layer 6 and depositing a second photoresist layer 7 on the entire surface of the resulting structure comprising the SOG film 5 positioned above the semiconductor substrate extending between the adjacent first patterns 2A, 2B and the exposed nitride layer; and planarizing and removing the second photoresist layer 7 to expose a top surface 5B of the SOG film positioned above the semiconductor substrate extending between the adjacent first patterns 2A, 2B; and, etching the SOG film so positioned to expose the nitride film thereunder thereby forming a mask pattern for contact hole 8A in the second photoresist layer 7.

14. The method of claim 13 further including an additional step of forming a contact hole by sequentially etching the exposed nitride layer 4 and the underlying insulating layer 3 positioned above the semiconductor substrate extending between the adjacent first patterns 2A, 2B utilizing the mask pattern 8A for contact hole, thereby forming a contact hole accessing a portion of the semiconductor substrate extending between the adjacent first patterns 2A, 2B.

15. The method of claim 13 wherein the SOG film is removed by etching in the presence of a gas selected from the group consisting of: CHF, $CF+O_2$ or $CHF+O_2$ to form the second pattern 5A comprising the portion of the SOG film positioned above the semiconductor substrate extending between the adjacent first patterns 2A, 2B with the portion of the first photoresist layer 6 positioned on the SOG film.

16. The method of claim 13 wherein the second photoresist layer 7 is removed to the extent to expose the top surface of the SOG film by a blanket etch back process.

17. The method of claim 13 wherein the second photoresist layer is planarized prior to being removed to the extent to expose the top surface of the SOG film.

18. The method of claim 13 wherein the mask pattern for contact hole is formed by dipping the exposed SOG film into a chemical etchant to remove the SOG film positioned above the semiconductor substrate extending between the adjacent first patterns 2A, 2B.

19. The method of claim 18 wherein the etchant is selected from the group consisting of: $NH_4OH{:}HF$, NiKOH and deionized water-HF.

20. The method of claim 13 wherein the baking of the SOG film is performed in a hot plate at a temperature of about 200 degrees Celsius for a period of about 1 minute.

21. The method of claim 13 wherein the baking of the SOG film is performed in a convection oven at a temperature of about 200 degrees Celsius for a period of about 30 minutes.

* * * * *